US012812918B2

(12) United States Patent
Mulfinger et al.

(10) Patent No.: US 12,812,918 B2
(45) Date of Patent: Nov. 24, 2026

(54) INTEGRATED CIRCUIT STRUCTURE WITH DIFFUSION BREAK IN P-TYPE FIELD EFFECT TRANSISTOR REGION AND METHOD

(71) Applicant: GlobalFoundries U.S. Inc., Malta, NY (US)

(72) Inventors: George Robert Mulfinger, Queensbury, NY (US); Pushparaj Pathak, Ballston Spa, NY (US); Selina A. Mala, Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 600 days.

(21) Appl. No.: 18/453,507

(22) Filed: Aug. 22, 2023

(65) Prior Publication Data

US 2025/0126888 A1 Apr. 17, 2025

(51) Int. Cl.

| | |
|---|---|
| ***H10D 30/69*** | (2025.01) |
| ***H10D 30/67*** | (2025.01) |
| ***H10D 86/00*** | (2025.01) |
| ***H10D 86/01*** | (2026.01) |
| ***H10D 86/40*** | (2025.01) |
| ***H10W 10/00*** | (2026.01) |
| ***H10W 10/17*** | (2026.01) |
| ***H10W 10/40*** | (2026.01) |
| ***H10W 10/50*** | (2026.01) |

(52) U.S. Cl.

CPC ....... *H10D 30/795* (2025.01); *H10D 30/6741* (2025.01); *H10D 86/0221* (2025.01); *H10D 86/201* (2025.01); *H10D 86/421* (2025.01); *H10W 10/0145* (2026.01); *H10W 10/041* (2026.01); *H10W 10/051* (2026.01); *H10W 10/061* (2026.01); *H10W 10/17* (2026.01); *H10W 10/40* (2026.01); *H10W 10/50* (2026.01)

(58) Field of Classification Search

CPC .................................................... H10D 30/795

See application file for complete search history.

(56) References Cited

U.S. PATENT DOCUMENTS

| | | | | |
|---|---|---|---|---|
| 9,899,267 | B1 * | 2/2018 | Liou | H10D 84/038 |
| 9,917,103 | B1 | 3/2018 | Mulfinger et al. | |
| 10,177,151 | B1 * | 1/2019 | Wang | H10D 84/0188 |

(Continued)

OTHER PUBLICATIONS

U.S. Appl. No. 18/340,463, entitled "Semiconductor Device Including Diffusion Break Structure and Method of Forming Semiconductor Device," filed Jun. 23, 2023, 26 pages.

*Primary Examiner* — Daniel Luke

(74) *Attorney, Agent, or Firm* — Erica Ee; Hoffman Warnick LLC

(57) ABSTRACT

An integrated circuit (IC) structure. The IC structure includes an insulator layer over a substrate. The substrate includes a first semiconductor material and a semiconductor layer over the insulator layer. The semiconductor layer includes a second semiconductor material different from the first semiconductor material. The IC structure further includes a first diffusion break, including: a fill material at least partially filling an opening within the semiconductor layer, the opening including curved side surfaces. By including the fill material at least partially within the opening, the stress and/or strain in the IC structure can be maintained without connecting the fill materials to a voltage.

14 Claims, 8 Drawing Sheets

(56) References Cited

U.S. PATENT DOCUMENTS

| | | | | |
|---|---|---|---|---|
| 10,505,546 | B2 * | 12/2019 | Song | H03K 19/17724 |
| 10,580,684 | B2 | 3/2020 | Wallner et al. | |
| 10,910,376 | B2 * | 2/2021 | Park | H10D 84/038 |
| 10,991,824 | B2 * | 4/2021 | Wu | H10D 30/62 |
| 11,251,313 | B2 * | 2/2022 | Kang | H10D 30/6757 |
| 2019/0229183 | A1 | 7/2019 | Wang et al. | |
| 2024/0072059 | A1 * | 2/2024 | Gu | H10D 86/201 |
| 2024/0096980 | A1 * | 3/2024 | Lee | H10D 64/017 |
| 2024/0258316 | A1 * | 8/2024 | Song | H10D 84/0135 |

* cited by examiner

INTEGRATED CIRCUIT STRUCTURE WITH DIFFUSION BREAK IN P-TYPE FIELD EFFECT TRANSISTOR REGION AND METHOD

BACKGROUND

Embodiments of the disclosure relate generally to integrated circuit (IC) structures. More particularly, the disclosure relates to IC structures with diffusion breaks in p-type field effect transistor regions and methods of forming the diffusion breaks.

Integrated circuit (IC) chips have billions of devices thereon, such as transistors, capacitors, and resistors. Devices often require physical and/or electrical isolation from one another to prevent performance issues, such as latch up, caused by close device proximity. However, including diffusion breaks between each device takes up valuable area on each chip that could otherwise be used to improve performance by, e.g., including more devices. Moreover, strain within device layers increases carrier mobility therein, thereby providing valuable performance improvements. Thus, it is advantageous to reduce the area of diffusion breaks without disrupting the strain within device layers.

SUMMARY

An aspect of the disclosure includes an integrated circuit (IC) structure, comprising: an insulator layer over a substrate, wherein the substrate includes a first semiconductor material; a semiconductor layer over the insulator layer, wherein the semiconductor layer includes a second semiconductor material different from the first semiconductor material; a first diffusion break, including: a fill material at least partially filling an opening within the semiconductor layer, the opening including curved side surfaces.

Another aspect of the disclosure includes an integrated circuit (IC) structure, comprising: an insulator layer over a substrate; a silicon-germanium (SiGe) layer over the insulator layer and including a p-type field effect transistor (p-FET) region; a diffusion break in the SiGe layer and including: a silicon layer positioned laterally between p-type source/drain regions; and a gate over the silicon layer, the gate electrically connected to a positive voltage source.

Another aspect of the disclosure includes a method of forming a method of forming an integrated circuit (IC) structure, comprising: forming a semiconductor layer over an insulator layer over a substrate, wherein the substrate includes a first semiconductor material and the semiconductor layer includes a second semiconductor material different from the first semiconductor material; and forming a first diffusion break in the semiconductor layer wherein the first diffusion break includes: a fill material at least partially filling an opening within the semiconductor layer, the opening including curved side surfaces.

It should be noted that all aspects, examples, and features of disclosed embodiments mentioned herein can be combined in any technically possible way. That is, two or more aspects of any of the disclosed embodiments, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1A:
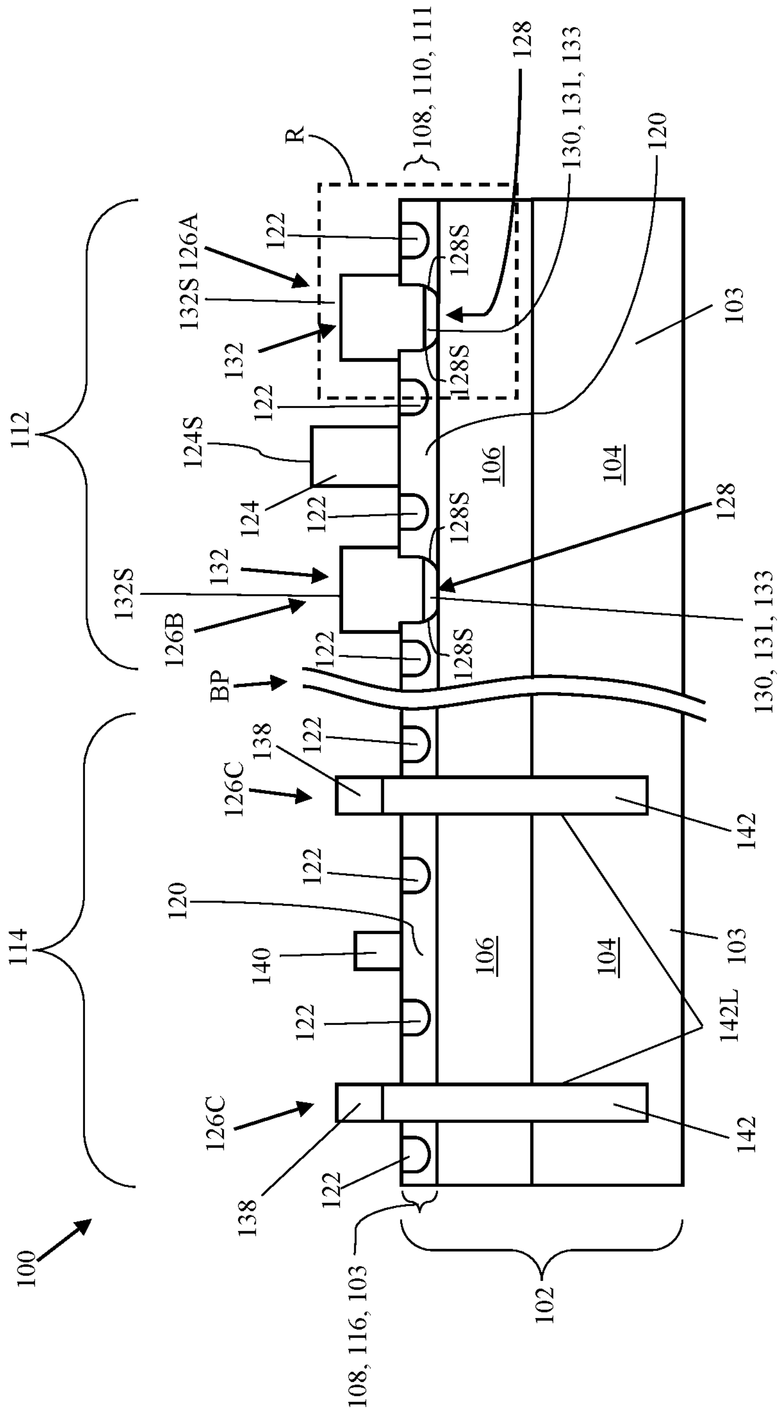
FIG. 1A shows a cross-sectional view of an integrated circuit structure with diffusion breaks including openings with curved side surfaces and fill materials therein, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure. The IC structure includes an insulator layer over a substrate. The substrate includes a first semiconductor material. The IC structure further includes a semiconductor layer over the insulator layer. The semiconductor layer includes a second semiconductor material different from the first semiconductor material. The IC structure further includes a first diffusion break, including: a fill material at least partially filling an opening within the semiconductor layer, the opening including curved side surfaces. By including the fill material at least partially within the opening, the strain, and therefore charge carrier mobility, in the IC structure can be maintained without electrically connecting the fill materials to a voltage.

Figure 1B:
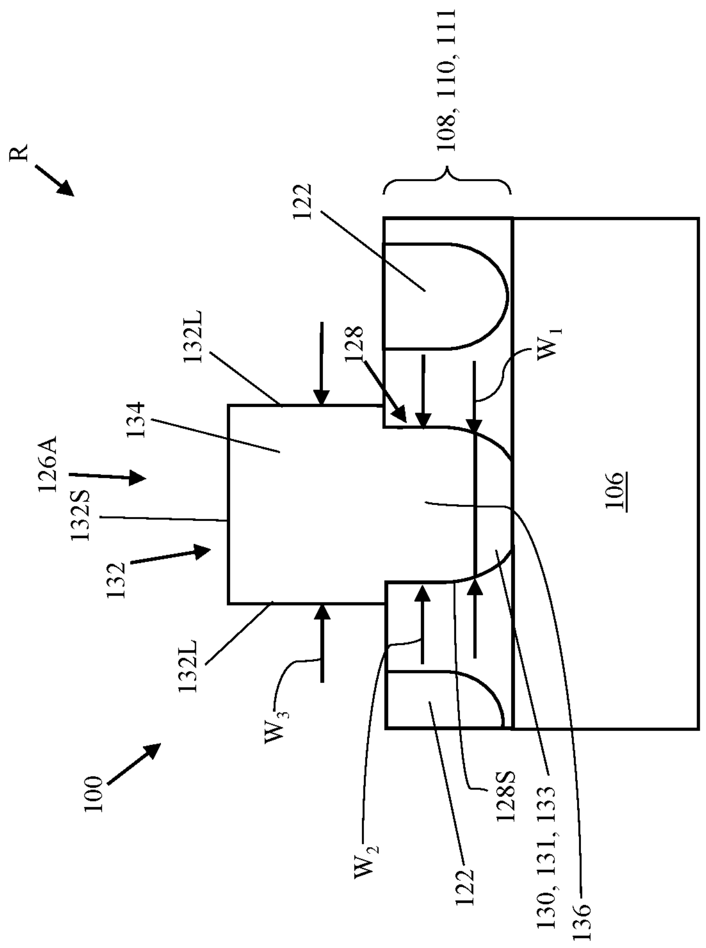
FIG. 1B shows an exploded view of a region of an integrated circuit structure with a fill material at least partially within an opening, according to embodiments of the disclosure.
Figure 2A:
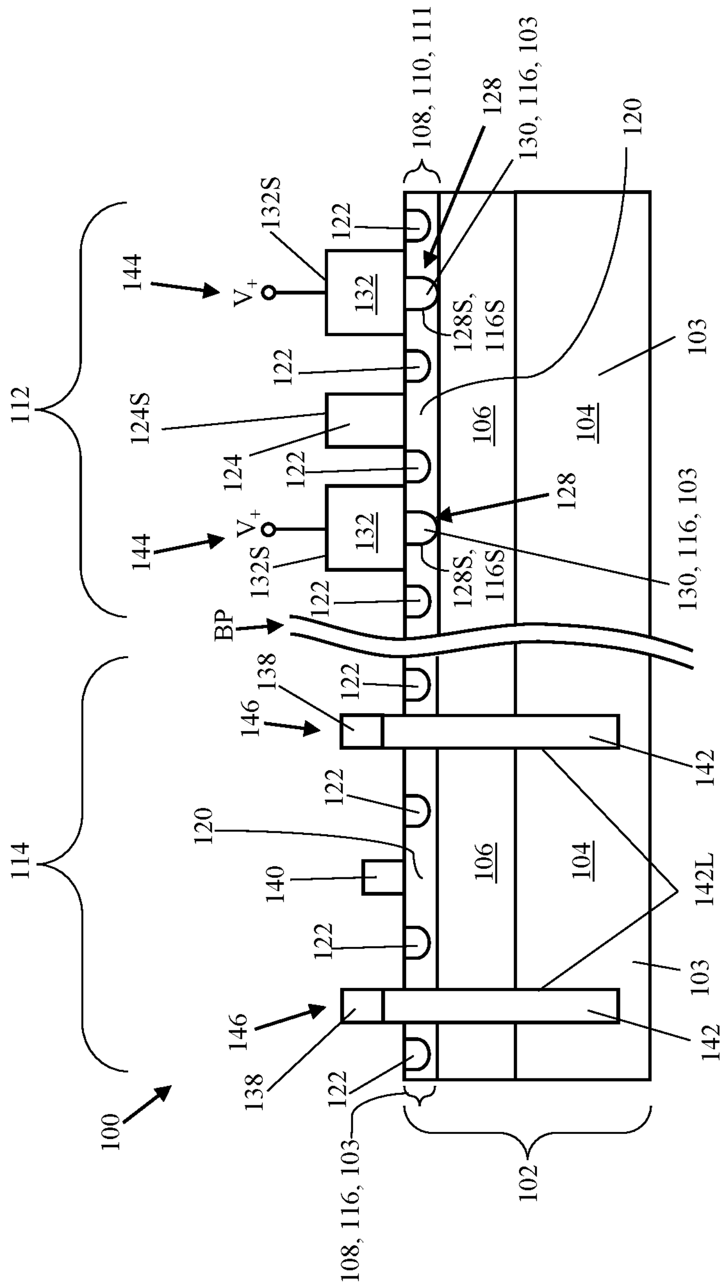
FIG. 2A shows a cross-sectional view of an integrated circuit structure with diffusion breaks including a silicon layer between a gate and an underlying insulator layer, according to embodiments of the disclosure.
Figure 2B:
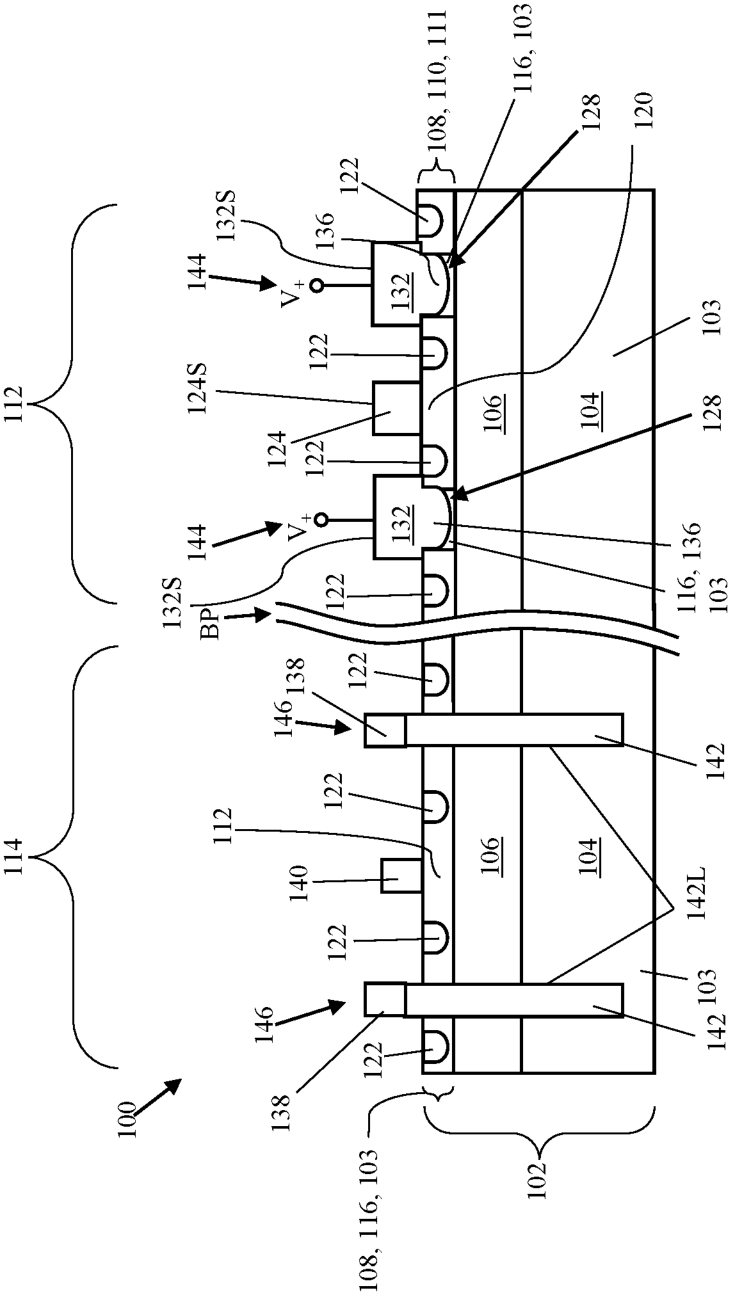
FIG. 2B shows a cross-sectional view of an integrated circuit structure with diffusion breaks including a silicon layer between an insulator layer and a gate with a lower portion within the opening, according to embodiments of the disclosure.

FIGS. 1A and 1B show cross-sectional views of an integrated circuit (IC) structure 100 (or simply "structure") and an exploded portion thereof, respectively, according to embodiments of the disclosure. FIGS. 2A and 2B show cross-sectional views of alternative embodiments of the structure 100.

Structure 100 may include a semiconductor substrate 102 (or simply "substrate"). In some embodiments, substrate 102 can be, for example, a first semiconductor material 103 (e.g., silicon). Substrate 102 may serve as the base on and/or in which IC devices are formed and may provide mechanical support thereto. In some implementations, substrate 102 may take the form of any substrate available for complementary metal oxide semiconductor (CMOS) processing including, but not limited to, a semiconductor wafer. In other implementations, substrate 102 may take the form of, for example, a semiconductor-on-insulator (SOI) substrate or a fully-depleted SOI substrate. An SOI substrate includes a layered semiconductor-insulator-semiconductor substrate in place of a more conventional silicon substrate (bulk substrate). Substrate 102 may include a base semiconductor layer 104 (sometimes referred to as "bulk semiconductor layer" in the art), a buried insulator layer 106 over base semiconductor layer 104, and a semiconductor-on-insulator (SOI) layer 108 (as discussed in greater detail below) over buried insulator layer 106. Portions, or the entirety, of substrate 102 (e.g., base semiconductor layer 104) may be strained. Strain, as used herein, is the mechanical deformation of the material lattice by the application of stress to portions of integrated circuits (e.g., the channel region) to improve charge carrier mobility therein. When applied in a longitudinal direction (i.e., in the direction of current flow), tensile stress is known to enhance electron mobility (or n-type field-effect transistor (n-FET) drive currents) while compressive stress is known to enhance hole mobility (or p-type field-effect transistor (p-FET) drive currents). Base semiconductor layer 104 may include but is not limited to: silicon, germanium, silicon germanium, silicon carbide, and those consisting essentially of one or more III-V compound semiconductors.

In the structures and method described herein, a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., p-type conductivity and n-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve p-type conductivity, whereas a silicon-based semiconductor material is typically doped with a Group V dopant, such as arsenic (As), phosphorous (P) or antimony (Sb), to achieve n-type conductivity. A gallium nitride (GaN)-based semiconductor material is typically doped with magnesium (Mg) to achieve p-type conductivity and with silicon (Si) or oxygen to achieve n-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Referring again to buried insulator layer 106, in a typical field effect transistor (FET), buried insulator layer 106 (hereafter "insulator layer 106") lowers the parasitic capacitance between the drain and source regions (discussed in further detail below), and confines the electrons flowing from the source to the drain, reducing leakage currents that damage performance. Insulator layer 106 may serve as a physical and/or electrical insulator within structure 100 and may include any appropriate dielectric, including, but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, other low dielectric constant (<3.9) material, or layers thereof. The precise thickness of insulator layer 106 may vary widely with the intended application. For example, in some implementations, insulator layer 106 may be ultra-thin and positioned on top of base semiconductor layer 104 in an FD-SOI substrate.

Referring again to SOI layer 108, SOI layer 108 may be ultra-thin and need not be doped to create the channel, thus making the transistor "fully depleted." The IC structure 100 can include, for example, p-type field effect transistor (PFET) region 112 and an n-type field effect transistor (NFET) region 114. Break point BP is illustrated by double wavy vertical lines and indicates PFET region 112 may be physically separated from NFET region 114 in some implementations. In other implementations, however, PFET region 112 may be adjacent NFET region 114. Optionally, the SOI layer 108 can be made of different semiconductor materials in the NFET region 114 and PFET region 112. For example, in some embodiments, within the NFET region 114 the SOI layer 108 can be a semiconductor layer 116 made of the first semiconductor material 103 (e.g., the SOI layer 108 in the NFET region 114 can be silicon), whereas within the PFET region 112, SOI layer 108 can take the form of a semiconductor layer 110 that may be made of a second semiconductor material 111 that is different from first semiconductor material 103 (e.g., SOI layer 108 in the PFET region 112 can be silicon germanium (SiGe), such as Ge-rich SiGe with, for example, greater than 40% Ge, such as 75% Ge or more). In the PFET region 112, the structure 100 can include one or more PFETs. In the NFET region 114, the structure 100 can include one or more NFETs.

Each FET can include an active device region within the SOI layer 108 and, within its active device region, a channel region (C) 120 between source and drain regions (S/D) 122. In PFETs, the source/drain regions 122 can have P-type conductivity at a relatively high conductivity level (e.g., can be P+ source/drain regions) and the channel region 120 can be either intrinsic (i.e., undoped) or can have N-type conductivity at a relatively low conductivity level (e.g., can be an N-channel region). In NFETs, the source/drain regions 122 can have N-type conductivity at a relatively high conductivity level (e.g., can be N+ source/drain regions) and the channel region 120 can be either intrinsic (i.e., undoped) or can have P-type conductivity at a relatively low conductivity level (e.g., can be a P-channel region).

Each FET can further include an active device gate 124 adjacent to (e.g., above, and immediately adjacent to) the active device region at the channel region 120. Those skilled in the art will recognize that, in a FET, a gate (also referred to as a gate structure) can include a gate dielectric layer, including one or more layers of gate dielectric material (not shown for simplicity), immediately adjacent to the channel region 120 and a gate conductor layer, including one or more layers of gate conductor material (not shown for simplicity), on the gate dielectric layer. In each FET, active device gate 124 and gate 132 can include at least a relatively thin gate dielectric layer immediately adjacent to the top surface of SOI layer 108 at the channel region 120 and a gate conductor layer on the gate dielectric layer. The gates could be any of gate-first polysilicon gate structures, gate-first high-K metal gate (HKMG) structures, or any other suitable type of gate structures. Optionally, the gates of PFETs can include different gate materials than the gates of the NFETs and, thus, can have different work functions. Although not shown (to avoid clutter in the drawings), active device gates 124 will further include gate sidewall spacers positioned laterally adjacent to sidewalls thereof (e.g., to electrically isolate the active device gate structure 124 from adjacent S/D regions 122). Such active device gate structures 124 are well known in the art and, thus, the details thereof have been omitted from the specification in order to allow the reader to focus on the salient aspects of the disclosed embodiments.

One advantage of FDSOI technology platforms is that the IC structure 100 can further include well regions within the substrate immediately adjacent the insulator layer below the FETs. For purposes of this disclosure, a well region refers to a region of semiconductor material doped (e.g., via a dopant implantation process or any other suitable doping process) so as to have a particular conductivity type. The conductivity type of the well region can be selected to adjust the threshold voltage of the FETs above. For example, for super low threshold voltage (SLVT) or low threshold voltage (LVT) FETs, NFETs are formed above Nwells and PFETs are formed above Pwells. For regular threshold voltage (RVT) or high threshold voltage (HVT) FETs, NFETs are formed above Pwells and PFETs are formed above Nwells. Typically, a circuit block will include all SLVT (or LVT) FETs with NFETs above Nwells and PFETs above Pwells or all RVT (or HVT) FETs with NFETs above Pwells and PFETs above Nwells. Another advantage of FDSOI technology processing platforms is that back gate biasing (referred to as back-biasing) can be employed to fine tune FET VTs. Forward back-biasing (FBB) refers to applying a gate bias voltage to the back gate (particularly, to the well region thereof) to reduce the VT of the FET, thereby increasing the switching speed. Generally, for a PFET, FBB is achieved by applying 0 volts or a negative gate bias voltage to the well region; whereas, for an NFET, FBB is achieved by applying a positive gate bias to the well region. Reverse back-biasing (RBB) refers specifically to applying a gate bias voltage to the back gate (particularly, to the well region thereof) to increase the VT of the FET, thereby decreasing the switching speed and reducing leakage current. Generally, for a PFET, RBB is achieved by applying a positive gate bias voltage to the well region; whereas, for an NFET, RBB is achieved by applying a negative gate bias voltage to the well region.

The descriptions of the NFETS and PFETs described above are provided for illustration purposes and are not intended to be limiting. Various NFET and PFET configurations are well known in the art and, thus, more specific details thereof have been omitted from the specification and drawings to allow the reader to focus on the salient aspects of the disclosed embodiments (e.g., related to the diffusion breaks discuss below).

In any case, in the disclosed embodiments structure 100 may include one or more diffusion breaks within the semiconductor layer 110 in the PFET region 112 (e.g., see first diffusion break 126A and optional second diffusion break 126B in the structure of FIGS. 1A-1B, see also diffusion break(s) 144 in the structures of FIGS. 2A and 2B). Diffusion break(s) (e.g., 126A-126B of FIGS. 1A-1B and 144 of FIGS. 2A and 2B) specifically within the PFET region 112 separate active device regions (e.g., to electrically isolate a P-type source/drain region 122 of one device from a P-type source/drain region 122 of another device) or devices within or on structure 100. A "diffusion break" is a term of art referring to an electrical and/or physical isolation region between active regions. Diffusion break(s) (e.g., 126A-126B of FIGS. 1A-1B and 144 of FIGS. 2A and 2B) may include subcomponents, such as an opening 128 within semiconductor layer 110, and a fill material 130 at least partially filling opening 128. Opening 128 is a physical space (or break) within semiconductor layer 110 and fill material 130 is a material that separates portions of semiconductor layer 110. Both opening 128 and fill material 130 are discussed in further detail herein. Such diffusion break(s) may vary greatly in size and/or dimension with intended use. In embodiments with multiple diffusion breaks (e.g., 126A-126B of FIGS. 1A-1B and 144 of FIGS. 2A and 2B) within the PFET region 112, the diffusion breaks can be spaced apart and can have essentially the same design. For example, as shown in FIG. 1A, structure 100 may further include a first diffusion break 126A and a second diffusion break 126B also within the PFET region 112. The second diffusion break 126B can have essentially the same structural configuration (i.e., the same design) as the first diffusion break 126A and can be spaced from the first diffusion break 126A (e.g., so as to define an active device region for a PFET positioned laterally between first diffusion break 126A and second diffusion break 126B). Second diffusion break 126B may function similarly, or even identically, to first diffusion break 126A, i.e., second diffusion break 126B physically or electrically isolates active regions.

As previously mentioned, the diffusion break(s) (e.g., first and second diffusion breaks 126A-126B in FIGS. 1A-1B and diffusion breaks 144 in FIGS. 2A and 2B) in the PFET region 112 may each include an opening 128 within semiconductor layer 110. Opening 128 may be a physical space between adjacent portions of semiconductor layer 110 and containing fill material 130. Such fill material 130 can preserve the lattice configuration within semiconductor layer 110 and, therefore, strain therein. Although two openings 128 for two diffusion breaks are shown for simplicity, structure 100 may include any number of openings 128 and thereby any number of diffusion breaks. In some embodiments, e.g., shown for illustration purposes in FIGS. 1A-1B and 2A, openings 128 may include curved side surfaces 128S. However, openings 128 may take the form of any shape, including squares, triangles, and other polygons. In another embodiment, shown in FIG. 1B, which shows an exploded view of dashed box R in FIG. 1A, curved side surfaces 128S of openings 128 are physically closer at a lower portion (horizontal width denoted as $W_1$) of each opening 128 than at an upper portion (horizontal width denoted as $W_2$) of each opening 128.

Referring specifically to the structure shown in FIGS. 1A-1B, first diffusion break 126A and optional second diffusion break 126B may, as mentioned previously, include fill material 130 at least partially filling opening 128. Fill material 130 may physically separate portions of semiconductor layer 110 and may specifically include dielectric material 131. The dielectric material 131 that may make up fill material 130 may include any known or future insulative material, e.g., silicon dioxide. For example, fill material 130 may include an oxide layer 133 (or "oxide material"). That is, fill material 130 may take the form of oxide layer 133. In other implementations, however, fill material 130 may include first semiconductor material 103, and first semiconductor material 103 may be silicon. In such an implementation, second semiconductor material 111 (i.e., of semiconductor layer 110) may be silicon germanium.

Referring specifically to the structures shown in FIGS. 2A and 2B, diffusion breaks 144 may, as mentioned previously, also include fill material 130 at least partially filling openings 128. In these embodiments, however, fill material 130 may be a semiconductor layer 116 of a distinct material composition from the second semiconductor material 111 of semiconductor layer 110. For example, as mentioned previously, the semiconductor layer 110 can be a second semiconductor material 111 (e.g., SiGe) different from the first semiconductor material (e.g., silicon) 103 of the base semiconductor layer 104 and SOI layer 108 within the NFET region 114. In this case, the fill material 130 may take the form of the first semiconductor material 103 (e.g., silicon). FIGS. 2A and 2B differ in that in the structure of FIG. 2A the semiconductor layer 116 extends essentially the full height of the opening 128, whereas in the structure of FIG. 2B the semiconductor layer 116 is only within the lower portion of the opening 128.

Although illustrated as a trapezoid with curved side surfaces for simplicity, fill material 130 in any of the disclosed embodiments may include any shape, including polygons or circular shapes. An advantage of including fill material 130 at least partially filling each opening 128 is that, as previously mentioned, the strain in the lattice configuration of semiconductor layer 110 is maintained by physically interposing fill material 130 at least partially within opening 128 and horizontally between portions of semiconductor layer 110. That is, when fill material 130 is within opening 128 (i.e., between portions of semiconductor layer 110), the lattice has no room to expand and, thus, lattice strain therein is maintained. Because of the lattice strain, fill material 130 does not require electrical connection (also known as biasing) to maintain performance gains from strain within semiconductor layer 110.

Diffusion break(s) (e.g., 126A-126B of FIGS. 1A-1B and 144 of FIGS. 2A and 2B) may each further include a gate 132 over fill material 130. Typically, a gate is a terminal in a transistor to which voltage is applied to allow or inhibit charge carrier flow in the channel region thereunder. Gate 132 may include one or more materials (e.g., at least a gate dielectric layer and a gate conductor layer on the gate dielectric layer). In one example, gate 132 may include polysilicon. In another example, gate 132 may include a metal over a high dielectric constant (high-k) dielectric material, and spacers along the sidewalls of the metal. A high-k dielectric layer functions as a gate insulator layer (not shown). A gate insulator layer may include any now known or later developed gate dielectric materials such as but not limited to hafnium silicate (HfSiO), hafnium oxide (HfO2), zirconium silicate (ZrSiOx), zirconium oxide (ZrO2), silicon oxide (SiO2), silicon nitride (Si3N4), silicon oxynitride (SiON), high-k material or any combination of these materials. Gate 132 may further include spacers (not shown) along the sidewalls of the gate metal, which may include any now known or later developed spacer material such as silicon nitride. Spacers generally function as protection barriers during fabrication and as electrical insulators during device operation. In some embodiments, the gate 132 over the fill material 130 can be made of the same gate dielectric and conductor materials as the active device gate 124 on the PFET.

As mentioned previously, fill material 130 at least partially fills opening 128, thereby preserving lattice strain in semiconductor layer 110. Therefore, in some embodiments, shown in FIG. 1A, where the fill material 130 is specifically a dielectric material, gate 132 is not electrically connected to an electric signal in the embodiment in FIGS. 1A and 1B (i.e., the gate is left floating). By not electrically connecting gate 132 to an electric signal, first diffusion break 126A occupies less layout area in structure 100, relative to diffusion breaks that require biasing, but maintains the same or similar charge carrier mobility. In other embodiments, however, shown in FIGS. 2A and 2B, where the fill material 130 is specifically a semiconductor layer 116 (e.g., of the first semiconductor material 103, such as, silicon) positioned laterally between P-type source/drain regions 122 of PFETs, gate 132 may be electrically connected to a positive voltage source $V_+$ (also referred to in the art as "Vdd") to continuously block current flow between the P-type source/drain regions 122.

In yet other embodiments, shown in FIGS. 1A, 1B, and 2B, but best illustrated in FIG. 1B, gate 132 includes an upper portion 134 over fill material 130. In such embodiments, upper portion 134 may have a greater horizontal width $W_3$ than a horizontal width $W_2$ of a lower portion 136 within opening 128 (i.e., substantially the same as horizontal width $W_2$ of an upper portion of opening 128). In other embodiments, shown in FIGS. 1A, 1B, 2A, and 2B, upper portion of gate 132 may include substantially linear side surfaces 132L. "Substantially linear" here means that no part of substantially linear side surfaces 132L deviates from a vertical straight line by more than +/−5 degrees. That is, substantially linear side surfaces 132L may include deviations within manufacturing tolerances but with overall shape that is approximately linear, i.e., a perfectly straight or approximately straight line. Although lower portion 136 is illustrated as substantially rectangular for simplicity, it may take the form of any shape or may conform to curved side surfaces 128S.

Referring back to FIG. 1A, structure 100 may further include, within the NFET region 114, a third diffusion break 126C, according to implementations of this disclosure. Third diffusion break 126C may function similarly to other diffusion breaks discussed herein, i.e., it physically and/or electrically isolates active regions (in this case of NFETs). However, third diffusion break 126C within the NFET region 114 may be distinct in structure from first diffusion break 126A and second diffusion break 126B within the PFET region 112. For example, third diffusion break 126C may include an active device gate 140 over channel region 120 and a gate 138 over a shallow-trench isolation (STI) structure 142. Distinguishing third diffusion break 126C from first diffusion break 126A and second diffusion break 126B is that STI structure 142 may extend through the SOI layer 108 and the insulator layer 106 into base semiconductor layer 104. In such an implementation, STI structure 142 may extend all the way to base semiconductor layer 104, which may disrupt the lattice in base semiconductor layer 104 and/or SOI layer 108 and diminishes strain therein. This situation reduces charge carrier mobility and therefore performance. Because third diffusion break 126C includes STI structure 142 extending to base semiconductor layer 104, lattice strain is lost in SOI layer 108 and, therefore, in source/drain regions 122 and channel region 120. Thus, SOI layer 108 in third diffusion break 126C has less strain and, therefore, less charge carrier mobility, within SOI layer 108. In some implementations, STI structure 142 of the third diffusion break 126C may include substantially straight side surfaces 142L along the vertical length of third diffusion break 126C.

As mentioned above, FIGS. 2A and 2B show cross-sectional views of structure 100, according to other implementations of this disclosure. In these embodiments, structure 100 may be substantially similar to structure 100 in other implementations except that the fill material 130 is a semiconductor layer 116 (e.g., of the first semiconductor material 103, such as a silicon layer), as discussed above. In such embodiments, each diffusion break 144 in the structure 100 must include gate 132 over semiconductor layer 116, which is positioned laterally between P-type source/drain regions 122 of different PFETs within semiconductor layer 110 and which is positioned vertically between gate 132 and insulator layer 106. Thus, each diffusion break 144 is effectively another PFET. Semiconductor layer 116 may include curved side surfaces 116S. Gate 132 may be similar to gate 132 in other implementations and may include lower portion 136 at least partially within opening 128, as illustrated in FIG. 2B. In such an embodiment, lower portion 136 may contact semiconductor layer 116. Gate 132, in embodiments shown in FIGS. 2A and 2B, must also be electrically connected to a positive voltage source $V_+$ (e.g., tied to a VDD rail) to continuously block current flow through semiconductor layer 116 between the P-type source/drain regions 122. In such embodiments, diffusion breaks 144 are electrically configured to not conduct (known in the art as "always off transistors"), i.e., diffusion breaks 144 will not conduct charge carriers through semiconductor layer 116 under gate 132 when electrically biased. Here, current leakage may be a function of the vertical thickness of condensed SiGe layer 118 when a positive voltage $V_+$ is applied to gates 132, thereby improving carrier mobility and reducing current leakage in channel region 120. For example, including semiconductor layer 116 between gate 132 (which is biased to $V_+$) and insulator layer 106 may lead to a ten times (10×) reduced leakage. A benefit to including semiconductor layer 116 between gate 132 and insulator layer 106 is that semiconductor layer 116 contributes to maintaining the strain (e.g., uniaxial strain) within condensed SiGe layer 118. By maintaining the stress/strain within condensed SiGe layer 118, structure 100 preserves performance and includes improved (i.e., less) current leakage.

As in the structure of FIG. 1A, the structures of FIGS. 2A and 2B may include an additional diffusion break 146 in NFET region 114. Additional diffusion break 146 may be substantially similar or even identical to third diffusion break 126C (FIG. 1A) in other implementations, and may include gate 138 over STI structure 142 extending through insulator layer 106 to bulk semiconductor layer 104 in substrate 102. In such implementations, STI structure 142 may include substantially linear side surfaces 142L. "Substantially linear" here means that no part of substantially linear side surfaces 142L deviates from a vertical straight line by more than +/−5 degrees. That is, linear side surfaces may include deviations within manufacturing tolerances but with overall shape that is approximately linear, i.e., a straight or nearly straight line.

Figure 3:
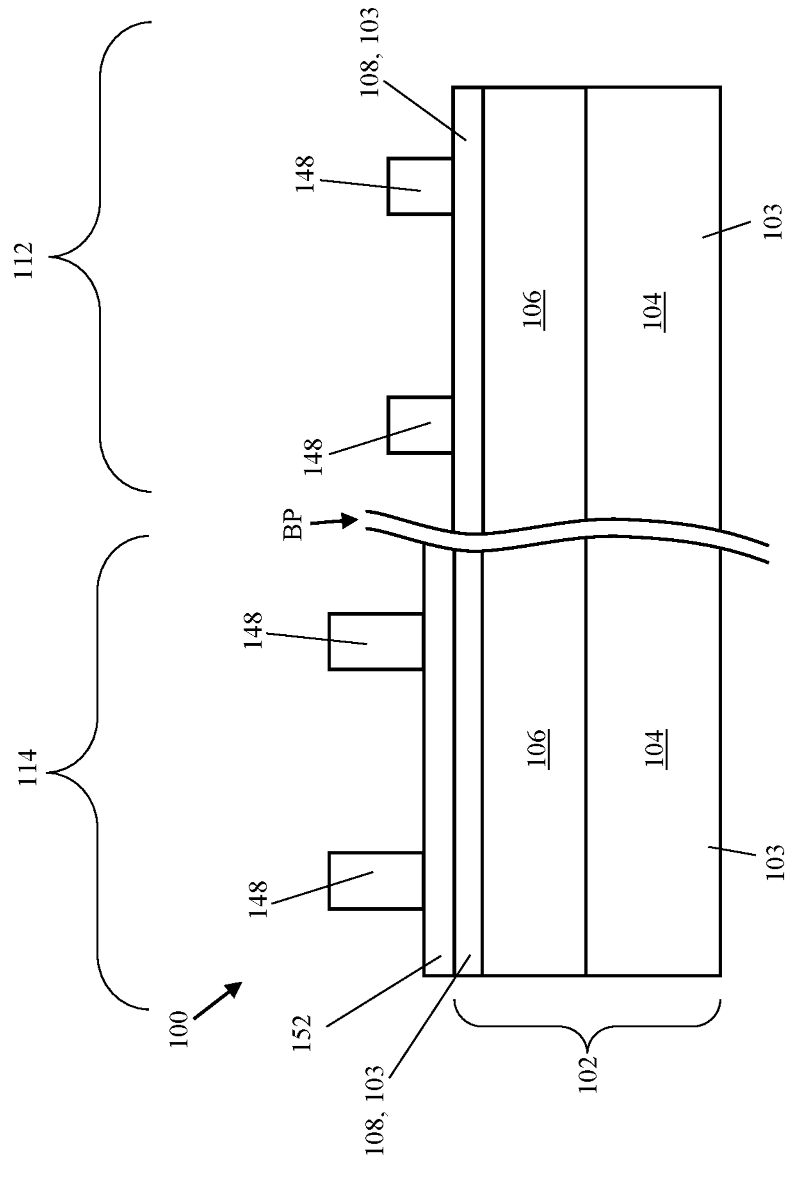
FIG. 3 shows a cross-sectional view of forming dummy gates over a substrate, according to embodiments of the disclosure.

FIGS. 3-6 show cross-sectional views illustrating a method of forming structure 100 according to implementations of this disclosure. Referring to FIG. 3, the method can begin with a substrate 102. Substrate 102 may be similar to substrate 102 in other implementations described herein. For example, the substrate 102 can include a base semiconductor layer 104, a buried insulator layer 106 on the base semiconductor layer 104, and a semiconductor-on-insulator (SOI) layer 108 on the insulator layer 106. The substrate 102 may be purchased pre-formed on, e.g., an SOI substrate or FD-SOI substrate. Alternatively, SOI layer 108 and insulator layer 106 may be formed over base semiconductor layer 104 through, e.g., standard CMOS fabrication methods, including, but not limited to deposition, separated by implanted oxygen (SIMOX), epitaxial growth, or wafer bonding processes. Other processes of forming SOI substrate 102 may also be possible. In any case, the base semiconductor layer 104 may include a first semiconductor material 103 (e.g., monocrystalline silicon) or any other suitable substrate material. The buried insulator layer 106 may include silicon dioxide or any other suitable insulator material. The SOI layer 108 may, like the base semiconductor layer 104, include the first semiconductor material (e.g., monocrystalline silicon).

The method may include forming a hard mask layer 152 over the SOI layer 108 in the NFET region 114 (see FIG. 3). The hard mask layer 152 can, for example, be a silicon nitride hard mask layer 152 formed (e.g., deposited) over the partially completed structure and then patterned (e.g., using conventional lithographic patterning and etch techniques) to expose the SOI layer 108 within the PFET region 112.

The method may further include forming, within the PFET region 112, a semiconductor layer 110 and at least one diffusion break in the semiconductor layer 110. For example, in some embodiments, the method can include forming a first diffusion break 126A and, optionally, a second diffusion break 126B during formation of the structure shown in FIGS. 1A-1B. In other embodiments, the method can include forming diffusion breaks 144 during formation of the structures shown in FIGS. 2A and 2B. Forming semiconductor layer 110 may include converting a portion of SOI layer 108 within PFET region 112 from first semiconductor material 103 (e.g., silicon) to second semiconductor material 111 (e.g., SiGe) and concurrently forming opening(s) 128 at least partially filled with fill material 130 therein, as described in greater detail below. During such processing, the hard mask layer 152 protects SOI layer 108 within the NFET region 114 preventing conversion from Si to SiGe.

More specifically, the method can include forming sacrificial structures (also referred to herein as dummy gates 148) on the SOI layer 108 in the PFET region 112 and, optionally, on the hard mask layer 152 in the NFET region 114 (see FIG. 3). The dummy gates 148 can be formed, for example, by depositing a sacrificial layer over the partially completed structure. The material of the sacrificial layer should be different from the first and second semiconductor materials so that it can be selectively etched during subsequent processing to remove the dummy gates. The sacrificial layer can then be patterned (e.g., using conventional lithographic patterning and etch processes or any other suitable patterning process) to form the dummy gates 148 at desired locations on the SOI layer 108 in the PFET region 112 and, optionally, on the hard mask layer 152 in the NFET region 114.

Figure 4:
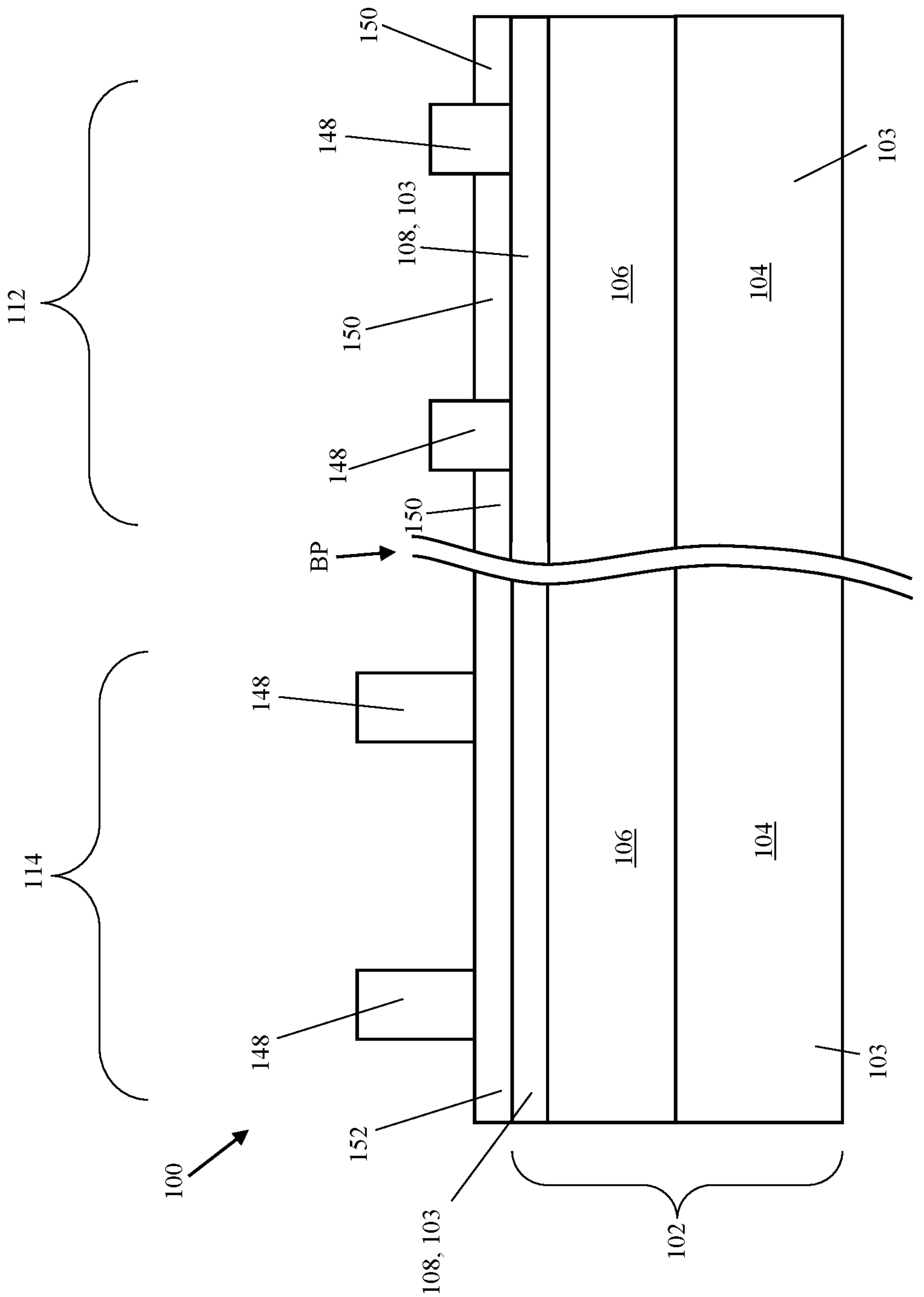
FIG. 4 shows a cross-sectional view of forming a silicon-germanium layer about dummy gates, according to embodiments of the disclosure.
Figure 5:
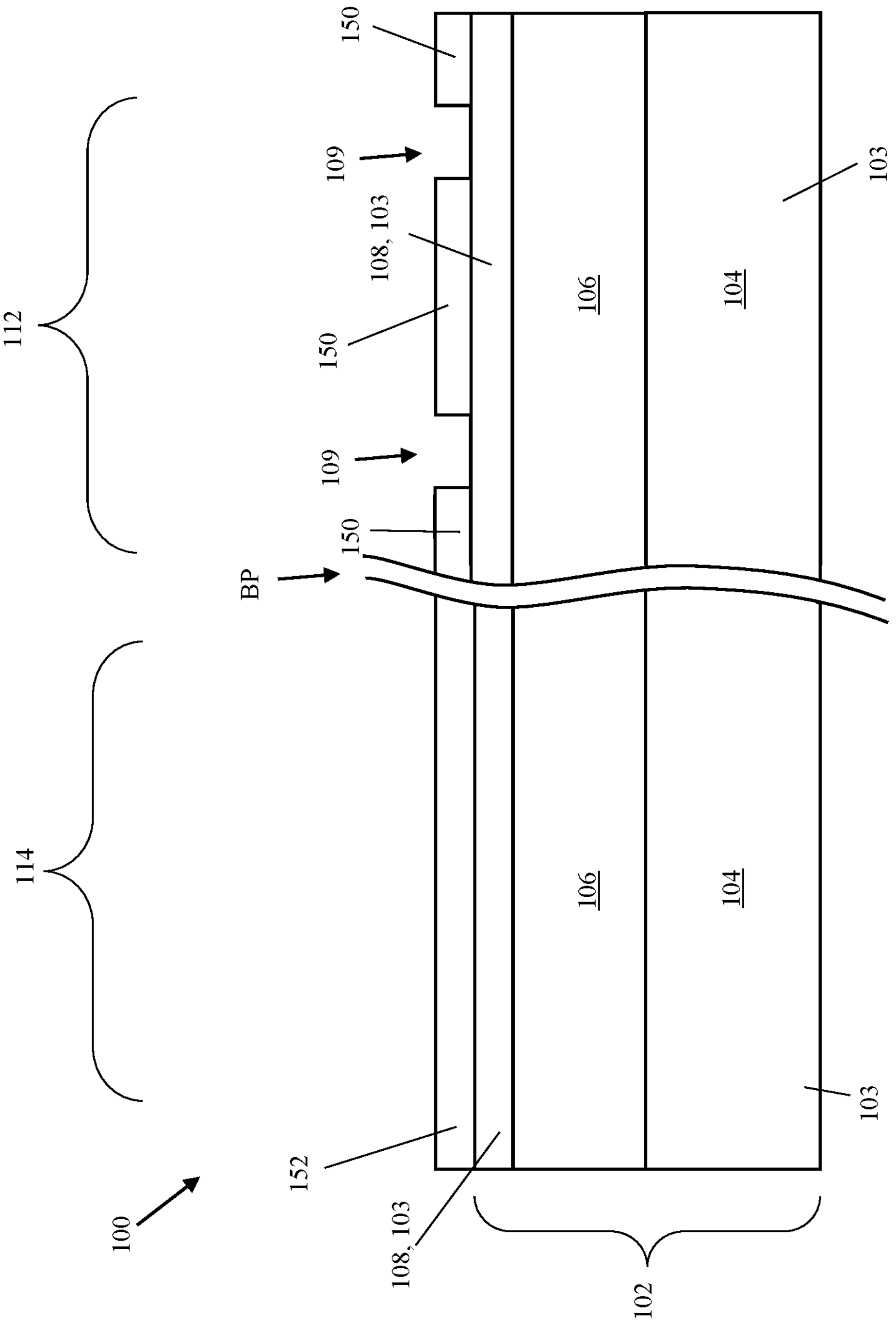
FIG. 5 shows a cross-sectional view of an integrated circuit structure after removing dummy gates, according to embodiments of the disclosure.

The method can further include forming an uncondensed silicon germanium (SiGe) layer 150 over the partially completed structure so as to laterally surround the dummy gates 148 (see FIG. 4). For purposes of this disclosure, an "uncondensed SiGe" layer refers to an SiGe layer with a relatively low Ge concentration (e.g., approximately 30% or less, such as 25%). Such a SiGe layer can be formed, for example, by epitaxial deposition.

Figure 6:
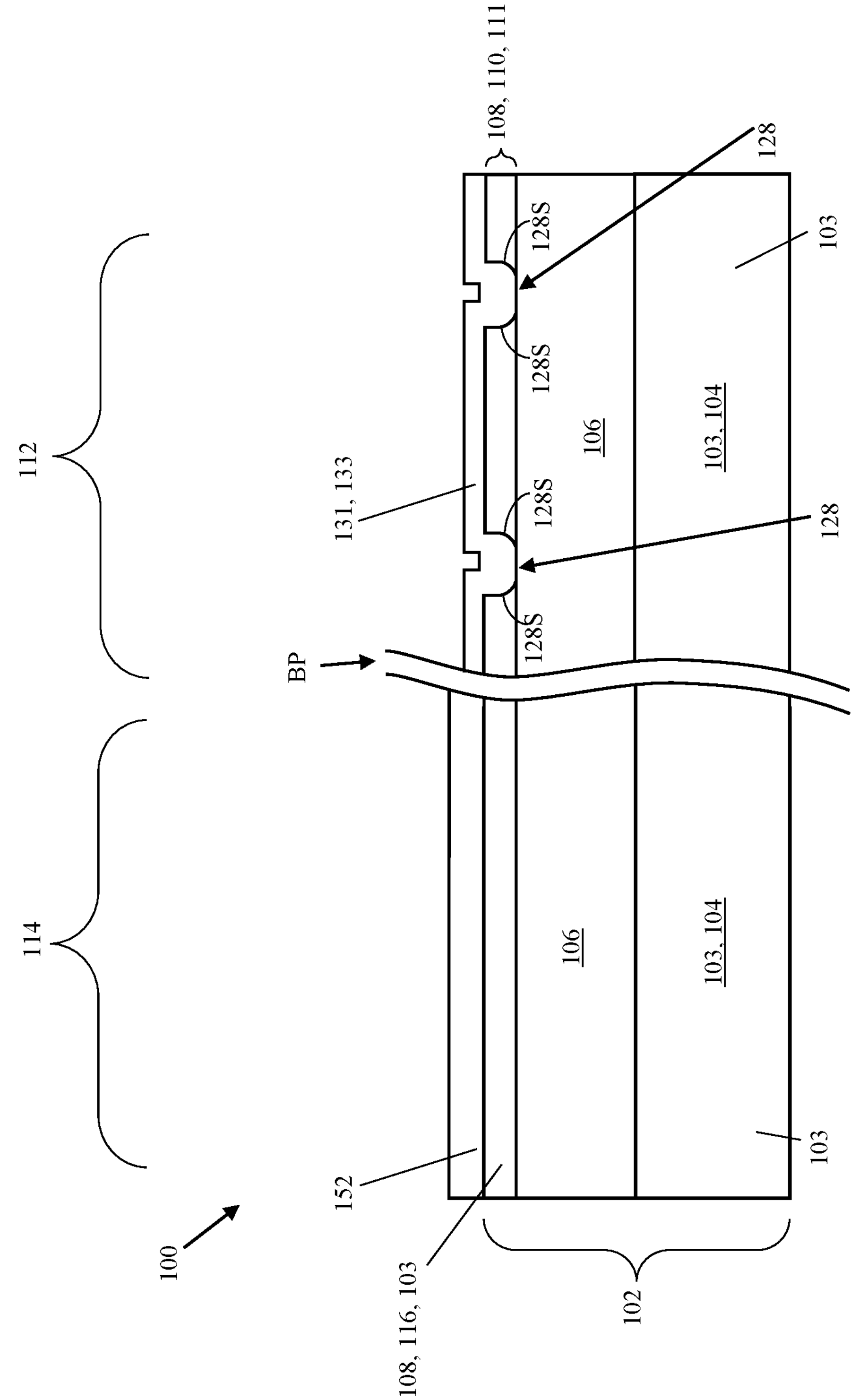
FIG. 6 shows a cross-sectional view of an integrated circuit structure after opening formation and a silicon-germanium condensation step, according to embodiments of the disclosure.

In some embodiments, the method can include selectively removing dummy gates 148 following formation of the uncondensed SiGe layer 150 (FIG. 5), thereby leaving gaps in the uncondensed SiGe layer 150 and, thus, leaving sections 109 of the SOI layer 108 as well as vertical surfaces of the uncondensed SiGe layer 150 unprotected (i.e., exposed), as illustrated. Next, a germanium condensation process (known as "SiGe condensation" or "Ge condensation") can be performed. Various techniques for performing Ge condensation are well known in the art and, thus, the details thereof have been omitted from this specification in order to allow the reader to focus on the salient aspects of the disclosed embodiments. However, those skilled in the art will recognize that Ge condensation processes generally include one or more thermal oxidation processes. Various thermal oxidation processes are also well known in the art and, thus, the details thereof have been omitted form this specification in order to allow the reader to focus on the salient aspects of the disclosed embodiments. In any case, such thermal oxidation process(es) result in oxidation of exposed semiconductor surfaces and, thereby formation of an oxide layer 133, which causes the germanium atoms from uncondensed SiGe layer 150 to diffuse into adjacent portions of the SOI layer 108 below, thereby converting portions of the SOI layer 108 into a Ge-rich SOI layer (also referred to herein as a condensed SiGe layer) i.e., into the semiconductor layer 110 made of the second semiconductor material 111 of SiGe. Since the gaps in the uncondensed SiGe layer 150 leave sections 109 of SOI layer 108 as well as vertical surfaces of the uncondensed SiGe layer 150 exposed during Ge condensation, these areas are also oxidized. As a result, the semiconductor layer 110 will have openings 128 (also referred to herein as breaks) formed therein. The openings 128 can have curved sidewalls 128S and will be at least partially filled with dielectric material 131 (i.e., the oxide layer 133) (FIG. 6). It should be noted that the sections 109 of the SOI layer 108 can be completely oxidized, as shown in FIG. 6, so that the dielectric material 131 (i.e., the oxide layer 133) in the openings 128 is immediately adjacent to the buried insulator layer 106 (e.g., during formation of the structure shown in FIGS. 1A and 1B). Alternatively, the sections 109 of the SOI layer 108 within the gaps may only be partially oxidized (not shown) so that the openings 128 in the semiconductor layer 110 include the first semiconductor material (e.g., silicon of the SOI layer 108) in a lower portion of the opening 128 immediately adjacent to the buried insulator layer 106 and dielectric material 131 (i.e., the oxide layer 133) in an upper portion of opening 128 on the first semiconductor material (e.g., during formation of the structure shown in FIG. 2B).

In other embodiments, the method can include leaving dummy gates 148 in place and, thereby protecting the sections 109 of SOI layer 108 during the Ge condensation process (not shown). In this case, it should be understood that the sections 109 of the SOI layer 108 (which remain protected by the dummy gates 148) would not be oxidized during Ge condensation, effectively creating openings 128 in the semiconductor layer 110 that are filled with remaining sections of SOI layer 108 (i.e., semiconductor layer 116) as opposed to the dielectric material 131 (e.g., during formation of the structure shown in FIG. 2A with semiconductor layer 116). In this case, dummy gates 148 can be selectively removed following Ge condensation.

In any case, the method can further include, following Ge condensation, removing the oxide layer 133 from the top surface of the semiconductor layer 110 (e.g., using a conventional oxide removal process, such as an oxide strip process). Removal of the oxide layer 133 from the top surface of the semiconductor layer 110 can also result in the removal of the oxide layer 133 from the upper portions of the openings 128. Thus, for example, during formation of the structure of FIG. 1A 1B, dielectric material 131 (i.e., oxide layer 133) will remain at least in the lower portions of the openings 128; whereas, during formation of the structure of FIG. 2B, dielectric material 131 (e.g., oxide layer 133) may be completely removed from the openings 128, leaving only the first semiconductor material 103 (e.g., semiconductor layer 116) in the lower portions of the openings 128. That is, fill material 130 may include first semiconductor material 103, in some implementations. It should be understood that, during formation of the structure of FIG. 2B, openings 128 would be substantially filled with the first semiconductor material 103 (e.g., semiconductor layer 116); however, the semiconductor layer 110 may be thicker (i.e., may have a top surface at a greater distance from the top surface of the buried insulator layer 106) than the semiconductor layer 116 within the opening 128.

Thus, as described above, forming of the diffusion break (s) (e.g., 126A-126B in the structure of FIGS. 1A-1B or 144 in the structures of FIGS. 2A and 2B) in the PFET region 112 includes concurrently forming a semiconductor layer 110 and, within the semiconductor layer 110, openings 128 with fill material 130 at least partially filling openings 128. Openings 128 containing fill material 130 may be formed simultaneously with semiconductor layer 110 during the germanium condensation step described herein. Openings 128 may include curved side surfaces 128S due, at least in part, to the oxidation process in the germanium condensation step being isotropic, i.e., the oxygen molecules bombard exposed sections 109 of SOI layer 108 the same in all directions. Similarly, oxidized portions of SOI layer 108 may become fill material 130. Fill material 130 may therefore include one of dielectric material 131, and first semiconductor material 103.

The method can further include performing additional front end of the line (FEOL) processing to form one or more PFETs in the PFET region 112 and, optionally, one or more NFETs in the NFET region 114. FEOL processing (e.g., for FDSOI or other advanced semiconductor-on-insulator technology processing platforms) to form PFETs and NFETs is well known in the art and, thus, the details thereof have been omitted form this specification in order to allow the reader to focus on the salient aspects of the disclosed embodiments. However, it should be understood that such FEOL processing will include formation of active device gate(s) on active device region(s) for the PFET(s) and NFET(s) on the active device regions thereof. Additionally, as mentioned above, diffusion breaks in the disclosed structures can include gates. Thus, in the method, formation of active device gate(s) 124 for PFET(s) in the PFET region 112 can be performed simultaneously with formation of gates 132 on fill material 130 for diffusion breaks. Similarly, in the method, formation of active device gate(s) 140 for NFET(s) in the NFET region 114 can be performed simultaneously with the formation of gates on STI structure 142 for diffusion breaks. FEOL processing can further include formation of source/drain regions 122 (e.g., P-type source/drain regions in the PFET region 112 and N-type source/drain regions in the NFET region 114) on either side of the various gate structures, etc.

The method can further include performing conventional middle of the line (MOL) and back end of line (BEOL) processing. Such MOL and BEOL processing can be performed during formation of the structure of FIGS. 1A-1B so as to specifically leave the gates of the diffusion breaks floating. That is, the gates 132 of the diffusion breaks 126A-126B in the PFET region 112 and the gates 138 of the diffusion breaks 126C in the NFET region 114 will not be contacted and, thus, not biased. Such MOL and BEOL processing during formation of the structures of FIGS. 2A-2B can, however, specifically include electrically connecting the gates 132 of the diffusion breaks 144 in the PFET region 112 to a positive supply voltage rail. That is, the gates 132 of the diffusion breaks 144 in the PFET region 112 can be tied to VDD, while the gates 138 of the diffusion breaks 146 in the NFET region 114 are left floating. Techniques for performing MOL and BEOL processing are well known in the art and, thus, the details have been omitted in order to allow the reader to focus on the salient aspects of the disclosed embodiments.

The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles bombard the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Referring to FIG. 1A, which shows a cross-sectional view of completed structure 100, forming structure 100 may include removing a portion or all of oxide layer 133 by, e.g., etching, to make way for channel region 120 and source/drain regions 122 to be formed in semiconductor layer 110. Etching here is similar to etching in other implementations, i.e., material is removed. Active device gate 124 may be formed between first diffusion break 126A and second diffusion break 126B. Active device gate 124 may be formed simultaneously with gate 132 and may include the same or similar processes for forming gate 132. In one embodiment, shown in FIG. 1A, gate 132 may include forming active device gate 124 with upper surface 124S above upper surface 132S of gate 132 of first diffusion break 126A and upper surface 132S of gate 132 of second diffusion break 126B. That is, gate 132 and active device gate 124 may have different vertical heights. In other embodiments, shown in FIGS. 2A and 2B, forming gate 132 may include forming gate 132 over fill material 130 and electrically connecting gate 132 to positive supply voltage $V_+$. After forming gate 132 and active device gate 124, source/drain regions 122 may be formed within semiconductor layer 110 by, e.g., doping regions therein. Active device gate 124 may include upper surface 124S above upper surface 132S of gate 132 of first diffusion break 126A and upper surface 132S of gate 132 of second diffusion break 126B. P-type source/drain regions 122 may also be formed within semiconductor layer 110 and positioned laterally adjacent to opposing sides of first diffusion break 126A. As this process is well known in the art, no further details are necessary.

The method and structure as described above are used in the fabrication and operation of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. “Optional” or “optionally” means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as “about”, “approximately” and “substantially”, are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. “Approximately” as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:

an insulator layer over a substrate, wherein the substrate includes a first semiconductor material;

a semiconductor layer over the insulator layer, wherein the semiconductor layer includes a second semiconductor material different from the first semiconductor material; and a first diffusion break including a fill material at least partially filling an opening within the semiconductor layer, the opening including curved side surfaces;

a second diffusion break within the semiconductor layer, wherein the first diffusion break and the second diffusion break are each within a p-type field effect transistor region; and a third diffusion break within an n-type field effect transistor region, wherein the third diffusion break includes a gate over a shallow trench isolation (STI) structure, wherein the STI structure extends through the insulator layer to the substrate and includes substantially straight side surfaces.

2. The IC structure of claim 1, wherein the curved side surfaces of the opening are physically closer at a lower portion of the opening than at an upper portion of the opening.

3. The IC structure of claim 1, wherein the fill material includes an oxide material.

4. The IC structure of claim 1, wherein the fill material includes the first semiconductor material, and wherein the first semiconductor material is silicon and the second semiconductor material is silicon germanium.

5. The IC structure of claim 1, wherein the fill material includes a dielectric material and the gate is not electrically connected to an electric signal.

6. The IC structure of claim 1, wherein the fill material includes the first semiconductor material, and the gate is electrically connected to a positive voltage source.

7. The IC structure of claim 1, wherein the fill material only partially fills the opening and the gate includes a lower portion within the opening on the fill material and an upper portion on the lower portion over the opening, the upper portion having a greater horizontal width than a horizontal width of the lower portion.

8. The IC structure of claim 1, further comprising:

an active device gate between the first diffusion break and the second diffusion break, wherein the active device gate includes an upper surface above an upper surface of the gate of the first diffusion break and an upper surface of the gate of the second diffusion break.

9. The IC structure of claim 1, wherein the first diffusion break is identical to, and spaced from, the second diffusion break.

10. A method of forming an integrated circuit (IC) structure, comprising:

forming a semiconductor layer over an insulator layer over a substrate, wherein the substrate includes a first semiconductor material and the semiconductor layer includes a second semiconductor material different from the first semiconductor material;

forming a first diffusion break in the semiconductor layer, wherein the first diffusion break includes: a fill material at least partially filling an opening within the semiconductor layer, the opening including curved side surfaces;

forming a second diffusion break within the semiconductor layer, wherein the first diffusion break and the second diffusion break are each within a p-type field effect transistor region; and forming a third diffusion break within an n-type field effect transistor region, the third diffusion break including a gate over a shallow trench isolation (STI) structure, wherein the STI structure extends through the insulator layer to the substrate and includes substantially straight side surfaces.

11. The method of claim 10, wherein the forming of the semiconductor layer includes:

forming a silicon germanium layer by performing a germanium condensation process; and, during the germanium condensation process, performing one of the following:

leaving a section of a semiconductor-on-insulator (SOI) layer unprotected so that the germanium condensation process results in the opening in the silicon germanium layer and a dielectric material within the opening; and protecting the section of the SOI layer so that the germanium condensation process results in the opening in the silicon germanium layer and a remaining section of the SOI layer within the opening.

12. The method of claim 10, wherein the fill material includes a dielectric material, wherein the forming of the first diffusion break includes forming an additional gate structure over the dielectric material, and wherein the additional gate structure over the dielectric material is not electrically connected to an electric signal.

13. The method of claim 10, wherein the fill material includes the first semiconductor material, wherein the forming of the first diffusion break further includes forming an additional gate structure over the fill material, and wherein the additional gate structure over the fill material is electrically connected to a positive supply voltage.

14. The method of claim 10 further comprising:

forming an active device gate between the first diffusion break and the second diffusion break, wherein the active device gate includes an upper surface above an upper surface of gate of the first diffusion break and an upper surface of the gate of the second diffusion break.

* * * * *